(12) United States Patent
Read et al.

(10) Patent No.: US 12,398,078 B2
(45) Date of Patent: Aug. 26, 2025

(54) LOCALIZED PARTICLE ADDITIONS TO REDUCE DEFECTS IN CERAMIC MATRIX COMPOSITES CAUSED BY COMPLEX GEOMETRY PREFORMING

(71) Applicant: Raytheon Technologies Corporation, Farmington, CT (US)

(72) Inventors: Kathryn S. Read, Marlborough, CT (US); Andrew J. Lazur, Laguna Beach, CA (US)

(73) Assignee: RTX Corporation, Farmington, CT (US)

( * ) Notice: Subject to any disclaimer, the term of this patent is extended or adjusted under 35 U.S.C. 154(b) by 405 days.

(21) Appl. No.: 17/339,190

(22) Filed: Jun. 4, 2021

(65) Prior Publication Data
US 2022/0388913 A1    Dec. 8, 2022

(51) Int. Cl.
*C04B 35/80* (2006.01)
*B05D 1/12* (2006.01)
(Continued)

(52) U.S. Cl.
CPC .............. *C04B 35/80* (2013.01); *B05D 1/12* (2013.01); *B05D 1/32* (2013.01);
(Continued)

(58) Field of Classification Search
CPC .............. C04B 35/80; C04B 35/62884; C04B 35/62892; C04B 35/62894; C04B 35/63416; C04B 35/6342; C04B 2235/3217; C04B 2235/3244; C04B 2235/3821; C04B 2235/3826; C04B 2235/3873; C04B 2235/422; C04B 2235/428; C04B 2235/5244; C04B 2235/5252; C04B 2235/5436; C04B 2235/614; C04B 2235/616; C04B 35/6264; C04B 2235/608; C04B 2235/775;
(Continued)

(56) References Cited

U.S. PATENT DOCUMENTS 5,439,627 A  *  8/1995  De Jager .............. B29C 70/025
                                              264/129
10,821,681 B2  11/2020  Weaver et al.
(Continued)

FOREIGN PATENT DOCUMENTS

EP    1640352 A1    3/2006
EP    3693350 A1    8/2020

OTHER PUBLICATIONS

Extended European Search Report for EP Application No. 22169520. 8, dated Oct. 25, 2022, 5 pages.

*Primary Examiner* — Nathan L Van Sell
(74) *Attorney, Agent, or Firm* — Kinney & Lange, P.A.

(57) ABSTRACT

A method of forming a ceramic matrix composite component includes forming a fiber preform, the fiber preform including a plurality of ceramic fiber plies, a non-reduced fiber region having an areal weight, and a reduced fiber region characterized by a reduced areal weight less than the areal weight of the non-reduced fiber region by at least 5 percent. The method further includes selectively applying ceramic particles to the reduced fiber region in such manner as to avoid applying the ceramic particles to the non-reduced fiber region, and subsequently densifying the preform.

14 Claims, 4 Drawing Sheets

(51) Int. Cl.
*B05D 1/32* (2006.01)
*C04B 35/628* (2006.01)
*C04B 35/634* (2006.01)
*C23C 16/02* (2006.01)

(52) U.S. Cl.
CPC .. *C04B 35/62884* (2013.01); *C04B 35/62892* (2013.01); *C04B 35/62894* (2013.01); *C04B 35/63416* (2013.01); *C04B 35/6342* (2013.01); *C23C 16/0272* (2013.01); *C04B 2235/3217* (2013.01); *C04B 2235/3244* (2013.01); *C04B 2235/3821* (2013.01); *C04B 2235/3826* (2013.01); *C04B 2235/3873* (2013.01); *C04B 2235/422* (2013.01); *C04B 2235/428* (2013.01); *C04B 2235/5244* (2013.01); *C04B 2235/5252* (2013.01); *C04B 2235/5436* (2013.01); *C04B 2235/614* (2013.01); *C04B 2235/616* (2013.01)

(58) Field of Classification Search
CPC .......... C04B 35/565; B05D 1/12; B05D 1/32; C23C 16/0272; Y02T 50/60; B32B 18/00
See application file for complete search history.

(56) References Cited

U.S. PATENT DOCUMENTS

| | | | |
|---|---|---|---|
| 2005/0118392 A1* | 6/2005 | Millard | C04B 35/14 428/131 |
| 2013/0244914 A1* | 9/2013 | Wu | C09K 8/805 264/610 |
| 2016/0136925 A1* | 5/2016 | Chamberlain | C04B 35/62844 428/113 |
| 2018/0002238 A1* | 1/2018 | Hockemeyer | C04B 35/571 |
| 2019/0389777 A1* | 12/2019 | Shi | C04B 35/62884 |
| 2020/0216362 A1 | 7/2020 | Sheedy et al. | |
| 2021/0053881 A1 | 2/2021 | Schmidt et al. | |
| 2021/0053882 A1 | 2/2021 | Jackson et al. | |

* cited by examiner

LOCALIZED PARTICLE ADDITIONS TO REDUCE DEFECTS IN CERAMIC MATRIX COMPOSITES CAUSED BY COMPLEX GEOMETRY PREFORMING

BACKGROUND

The present invention relates to the fabrication of ceramic matrix composites and more particularly, to a ceramic matrix composite having improved properties for operating in gas turbine engines.

Ceramic matrix composites are desirable for use in gas turbine engines due to their unique material properties including high temperature and oxidation resistance capabilities, high strength and creep resistance, high thermal conductivity, and low weight. Certain composite components, such as turbine engine components, can include complex curvatures and/or other features for which conventional layup techniques result in distortions and reduced fiber regions in the preform. Reducing these defects prior to matrix formation helps facilitate uniform density of the final component, which is critical to its performance, durability, and function.

SUMMARY

A method of forming a ceramic matrix composite component includes forming a fiber preform, the fiber preform including a plurality of ceramic fiber plies, a non-reduced fiber region having an areal weight, and a reduced fiber region characterized by a reduced areal weight less than the areal weight of the non-reduced fiber region by at least 5 percent. The method further includes selectively applying ceramic particles to the reduced fiber region in such manner as to avoid applying the ceramic particles to the non-reduced fiber region, and subsequently densifying the preform.

A fiber preform includes a plurality of ceramic fiber plies, a non-reduced fiber region having an areal weight, a reduced fiber region characterized by a reduced areal weight less than the areal weight of the non-reduced fiber region by at least 5 percent, and a deposition of ceramic particles selectively applied to the reduced fiber region.

Figure 1:
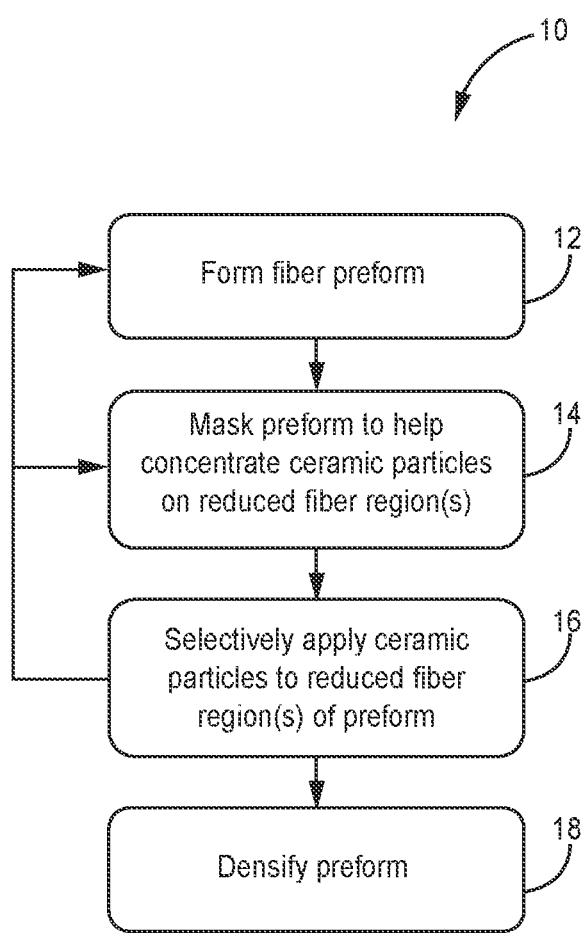
FIG. 1 is a flow chart illustrating steps of a method of forming a component from a fiber preform.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION

This disclosure presents a composite component and a method of forming such a composite component from a fiber preform. The preform can include one or multiple plies, the laying up of which involves joints and/or curved portions. Such areas of the preform can constitute reduced fiber regions requiring the local application of ceramic particles to fortify the preform prior to matrix formation. Ceramic particles can be selectively applied to the reduced fiber regions using various techniques.

Figure 2:
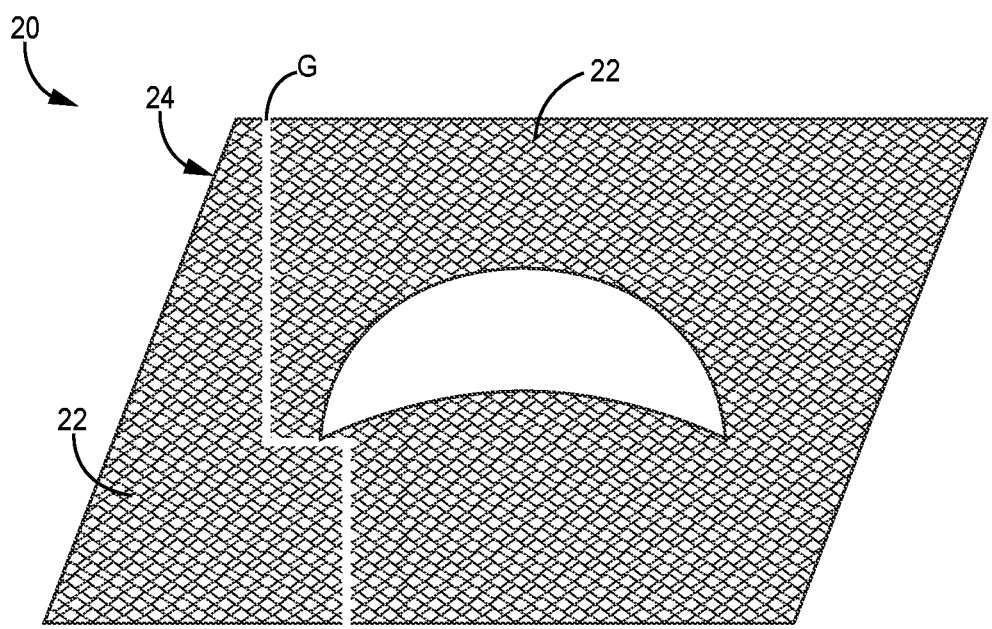
FIG. 2 is a simplified top plan view of a platform portion of the fiber preform.
Figure 3:
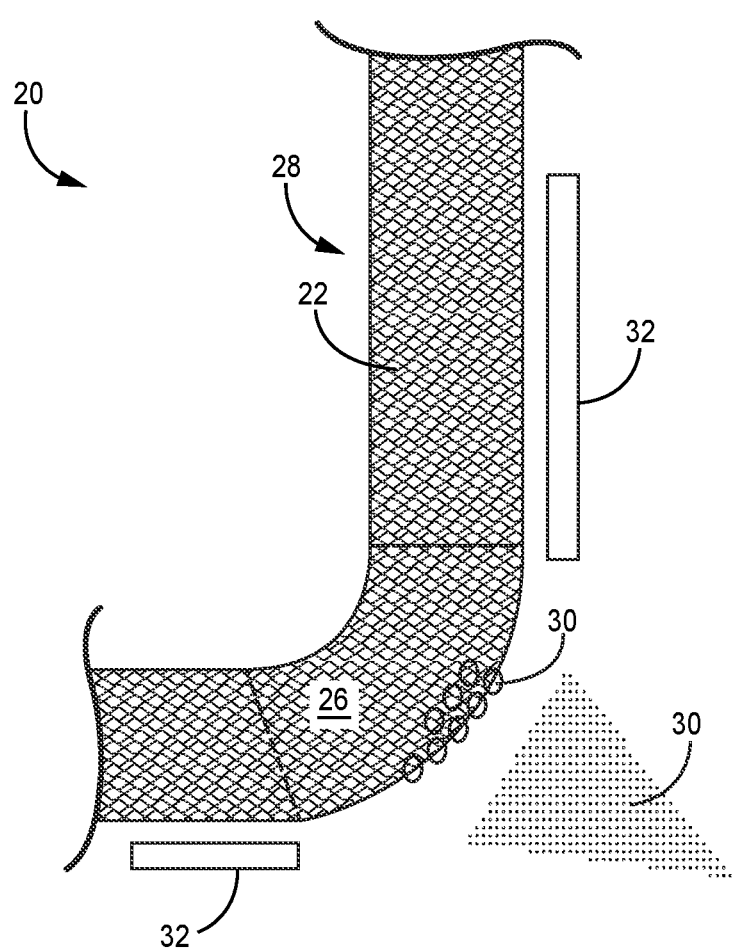
FIG. 3 is a simplified illustration of a curved region of the fiber preform.
Figure 4:
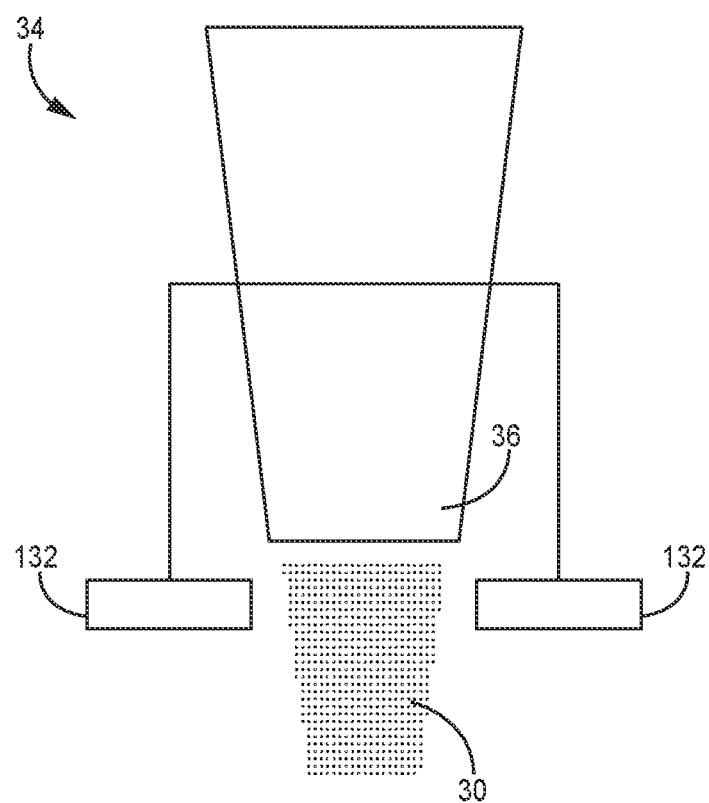
FIG. 4 is a simplified illustration of a ceramic particle applicator.

FIG. 1 is a flowchart illustrating selected steps 12-18 of method 10, used to form a ceramic matrix composite (CMC) component. FIGS. 2 and 3 are simplified views of portions of a preform having plies with reduced fiber regions. FIG. 4 is a simplified illustration of an applicator for applying ceramic particles to reduce fiber regions. Steps 12-18 are described below in combination with FIGS. 2-4.

At step 12, fiber preform 20 is formed. Preform 20 can be a net shape or near-net shape, two or three-dimensional structure made up of one or more plies 22 arranged in a desired manner. As used herein, the term "ply" can be interchangeable with terms such as "sheet" and "fabric". Plies 22 can be formed from braided, woven, and/or non-woven ceramic fibers or tows, which in an exemplary embodiment, can be formed from silicon carbide. Other suitable ceramics are contemplated herein. Plies 22 can further be formed from unidirectional and/or multidirectional (including randomly oriented) fibers. Exemplary plies 22 can have 5-harness or 8-harness weave or braided patterns. For a given preform 20 formed from multiple plies 22, plies 22 can, but need not be uniform in their design (e.g., composition, thickness, shaped, etc.).

Preform 22 can have an average density represented as, for example, average areal weight. Such characteristics can be derived from individual plies 22 making up preform 20. Due to various preforming techniques discussed in more detail below, preform 20 can develop one or more reduced fiber regions. As disclosed herein, a reduced fiber region can be a region of preform 20 having an areal weight reduced from the average areal weight by 5 percent or more. Inter or intra-ply gaps can also constitute a reduced fiber region, as the presence of such a gap can reduce the localized areal weight.

The arrangement of plies 22 can include one or a combination of layering, placing in an adjacent manner, or bending, to name a few non-limiting examples. FIG. 2 is a simplified elevation view of a portion of preform 20. More specifically, platform 24 of preform 20, can be part of a blade or vane for a gas turbine engine. Platform 24 is shown for simplicity without the corresponding airfoil. As shown, gap G exists between adjacent plies 22. Gap G can be created at the location of a butt joint or other type of joint. The width (i.e., distance between plies) of gap G can be generally even along its length. A width ranging from 0.050 inches to 0.500 inches (1.27 mm to 12.7 mm) can be considered a reduced fiber region for the purposes of this disclosure. Although only one is shown, platform 24 can include additional gaps of various widths, lengths, and/or positions based on the type and number of plies 22 used, as well as other factors relating to desired platform characteristics.

FIG. 3 is a simplified partial view of curved region 26 (indicated by dashed lines) of preform 20. Curved region 26 can be, for example, a fillet surface for providing structure and aerodynamic transition between platform 24 and airfoil 28, only a portion of which is shown in FIG. 3. Other types of curved regions in a preform (e.g., from the formation of flanges, channels, bosses, leading edges, etc.) are contemplated herein. The bending of ply (or plies) 22 to achieve such a curved geometry can cause distortion (e.g., fiber spreading) in the underlying fiber structure, particularly, but not exclusively, in the convex region. As such, curved region 26 can also constitute a reduced fiber region if the localized reduction in areal weight reaches the threshold of 5 percent.

One way to address reduced fiber regions is to overlay such regions with additional plies 22 or ply segments. This, however, can create high fiber density regions that can negatively impact mechanical and thermal properties in the final component. Accordingly, ceramic particles 30 (shown and labeled in FIG. 3) can be selectively applied to/deposited on reduced fiber regions (including to and extending beyond a ply/region surface), while avoiding non-reduced fiber regions (i.e., those within desired density parameters), in order to reduce deviations in areal weight, density, etc.

Suitable ceramic particles 30 can be formed from silicon carbide, boron carbide, silicon nitride, pure silicon, pure carbon, aluminum oxide, or hafnia, to name a few non-limiting examples. Ceramic particles 30 can be a homogeneous or heterogenous mixture of generally spherical, elongate, or otherwise irregularly shaped particles. In one embodiment, the D50 size of ceramic particle 30 can range from 10 micrometers to 80 micrometers. In one embodiment, particles 30 can range from 30 micrometers to 65 micrometers, and more specifically, from 40 to 45 micrometers. The technique used to apply ceramic particles 30 to preform 20 can, in some cases, vary based on particle size, as is discussed below with respect to step 16.

An optional masking step can be carried out at step 14, and may be desirable for facilitating the targeted delivery of ceramic particles 30 to reduced fiber regions. This helps to reduce waste of ceramic particles 30 and/or added weight to preform 20 from the extraneous application of ceramic particles 30. One option is to apply a stationary mask to/over preform 20. FIG. 3 shows masking element 32 covering non-fiber reduced regions of preform 20, which as shown, are straight segments. Masking element 32 can be a tape, shield, or film applied directly to or positioned offset from the surface of preform 30. Masking element 32 can further be discrete elements or a unitary structure. As shown in FIG. 3, masking element 32 exposes the convex surface of curved region (i.e., reduced fiber region) 26 to a plume of ceramic particles 30, permitting the selective and targeted delivery of ceramic particles 30 to this region.

FIG. 4 is a simplified illustration of applicator 34 with optional attached masking element 132 offset from tip 36. Masking element 132 element is similar to masking element 32 in that it helps target delivery of ceramic particles 30 to preform 20, however, masking element 132 is movable with applicator 34. Masking element 132 can be advantageous where the use of masking element 32 on/over preform 20 would be impractical due to size, cost, or time constraints. Masking element 132 can further include or be in communication with a reservoir (not shown) on applicator 34 such that ceramic particles 30 not permitted to pass through masking element 132 can be recycled and reused in subsequently applications.

At step 16, ceramic particles 30 can be selectively applied to reduced fiber regions of preform 20 via, for example, applicator 34. In an embodiment in which the size of ceramic particles 30 ranges from 10 micrometers to 25 micrometers, applicator 34 can be a pipette such that ceramic particles 30 are applied as droplets. More specifically, ceramic particles 30 can be in an aqueous suspension that can further include a poly-vinyl alcohol (PVA), solvent combinations such as PVB (poly-vinyl butyral) and ethanol, or other suitable binders. The particle loading of the suspension can range from 10 percent to 30 percent, and in an exemplary embodiment, from 20 percent to 25 percent. For droplet applications, it may not be necessary to use mask 32 or 132, as droplets can be applied to a targeted area in a relatively controlled manner. Whether or not to mask the non-fiber reduced regions for droplet applications can be based, for example, on the viscosity of the suspension, and/or the geometry and area of the fiber reduced region(s).

In an alternative embodiment in which the size of ceramic particles 30 is greater than 25 micrometers (e.g., 30 micrometers to 65 micrometers), applicator 34 can be a fluidized or dry spray system 34. In such an embodiment, it may be desirable to use one or a combination of mask 32 or 132 to focus the plume of ceramic particles 30 onto the reduced fiber region(s). In yet another alternative embodiment, ceramic particles 30 can be applied as a paste using a brush or other appropriate applicator 34. Such an embodiment may be favorable when ceramic particles 30 are chopped fibers or other generally larger particle sizes (e.g., >65 micrometers) relative to those already discussed herein. In any embodiment, application of ceramic particles 30 to reduced fiber regions can occur in one or multiple successive iterations to achieve the desired result.

At step 18, preform 20 can undergo matrix formation and densification using a chemical vapor infiltration or deposition (CVI or CVD) process. During densification, plies 22 are infiltrated by reactant vapors, and a gaseous precursor deposits on the fibers. The matrix material can be a silicon carbide or other suitable ceramic material. Densification is carried out until the resulting CMC has reached the desired residual porosity. In an alternative embodiment, densification can include other methodologies including but not limited to melt infiltration and polymer infiltration and pyrolysis.

It should be noted that steps 12 through 16 can be repeated as many times as necessary prior to densification in order to form the desired preform shape with the desired density.

Method 10 discussed above can include additional steps (inter-step or post processing) not shown in FIG. 1. For example, after step 18, various post-processing steps can be performed, such as the application of one or more protective coatings (e.g., environmental and/or thermal barrier coatings). A bond coat can also be applied to facilitate bonding between the CMC and a protective coating. Other protective coatings, especially those suitable for use in a gas turbine engine environment, are contemplated herein. Various inter-step processes can also be performed, such as the application of a tackifier to plies 22 at any point prior to step 18. Other inter-step processes like surface preparation and cleaning are contemplated herein. It should also be understood that alternative preform embodiments can include other types of reduced fiber regions, such as ply edges.

The resulting CMC components have desirable mechanical and thermal properties for harsh operating environments like the hot section of a gas turbine engine. Other aerospace applications include exhaust systems, ducting, shrouds, and sealing systems. The disclosed method can also be used to produce CMC components for maritime, power generation, and industrial applications.

Discussion of Possible Embodiments

The following are non-exclusive descriptions of possible embodiments of the present invention.

A method of forming a ceramic matrix composite component includes forming a fiber preform, the fiber preform including a plurality of ceramic fiber plies, a non-reduced fiber region having an areal weight, and a reduced fiber region characterized by a reduced areal weight less than the areal weight of the non-reduced fiber region by at least 5 percent. The method further includes selectively applying ceramic particles to the reduced fiber region in such manner as to avoid applying the ceramic particles to the non-reduced fiber region, and subsequently densifying the preform.

The method of the preceding paragraph can optionally include, additionally and/or alternatively, any one or more of the following features, configurations and/or additional components:

In the above method, the ceramic fiber plies can be formed from silicon carbide fibers.

In any of the above methods, the reduced fiber region can correspond to one of a curved region and a gap between adjacent ones of the plurality of plies.

In any of the above methods, a size of the ceramic particles can range from 10 micrometers to 25 micrometers.

In any of the above methods, the step of selectively applying the ceramic particles can include applying an aqueous suspension of the ceramic particles to the reduced fiber region.

In any of the above methods, the aqueous solution can be applied as droplets.

In any of the above methods, the aqueous suspension can include one of poly-vinyl butyral with ethanol and poly-vinyl alcohol.

In any of the above methods, a size of the ceramic particles can range from 30 micrometers to 65 micrometers.

In any of the above methods, the step of selectively applying the ceramic particles can include spraying the ceramic particles onto the reduced fiber region.

Any of the above methods can further include optionally masking the non-fiber reduced region.

In any of the above methods, the step of masking the non-fiber reduced region can include one of a stationary mask over the non-fiber reduced region and a mask attached to an applicator of the ceramic particles.

In any of the above methods, the step of densifying the fiber preform can include one of a chemical vapor infiltration and a chemical vapor deposition process.

In any of the above methods, the ceramic particles can be formed from a material selected from the group consisting of silicon carbide, silicon nitride, pure silicon, boron carbide, pure carbon, aluminum oxide, hafnia, and combinations thereof.

A fiber preform includes a plurality of ceramic fiber plies, a non-reduced fiber region having an areal weight, a reduced fiber region characterized by a reduced areal weight less than the areal weight of the non-reduced fiber region by at least 5 percent, and a deposition of ceramic particles selectively applied to the reduced fiber region.

The preform of the preceding paragraph can optionally include, additionally and/or alternatively, any one or more of the following features, configurations and/or additional components:

In the above preform, the fiber plies can be formed from silicon carbide fibers.

In any of the above preforms, the reduced fiber region can correspond to one of a curved region and a gap between adjacent ones of the plurality of plies.

In any of the above preforms, the gap can be a butt joint between adjacent ones of the plurality of fiber plies, and wherein a width of at least a portion of the gap ranges from 0.050 inches to 0.500 inches.

In any of the above preforms, the ceramic particles can be formed from a material selected from the group consisting of silicon carbide, silicon nitride, pure silicon, boron carbide, pure carbon, aluminum oxide, hafnia, and combinations thereof.

In any of the above preforms, a size of the ceramic particles can range from 30 micrometers to 65 micrometers.

In any of the above preforms, a size of the ceramic particles can range from 40 micrometers to 45 micrometers.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A method of forming a ceramic matrix composite component, the method comprising:
    forming a fiber preform, the preform comprising:
        a plurality of ceramic fiber plies;
        a non-reduced fiber region having an areal weight; and
        a reduced fiber region characterized by a reduced areal weight less than the areal weight of the non-reduced fiber region by at least 5 percent, the reduced fiber region further characterized as a gap between ceramic fibers within one of the plurality of ceramic fiber plies or ceramic fibers within adjacent ones of the plurality of ceramic fiber plies;
    masking the non-reduced fiber region;
    selectively applying ceramic particles to the reduced fiber region of the preform in such manner as to avoid applying the ceramic particles to the non-reduced fiber region, such that a resulting areal weight in the reduced fiber region is increased, thereby reducing a deviation in areal weight and a deviation in density between the reduced fiber region and the non-reduced fiber region; and
    subsequently densifying the preform.

2. The method of claim 1, wherein the ceramic fiber plies are formed from silicon carbide fibers.

3. The method of claim 1, wherein the reduced fiber region corresponds to one of:
    a curved region; and
    a gap between adjacent ones of the plurality of plies.

4. The method of claim 1, wherein a size of the ceramic particles ranges from 10 micrometers to 25 micrometers.

5. The method of claim 4, wherein the step of selectively applying the ceramic particles comprises applying an aqueous suspension of the ceramic particles to the reduced fiber region.

6. The method of claim 5 and further comprising: applying the aqueous suspension as droplets.

7. The method of claim 5, wherein the aqueous suspension comprises one of:
    poly-vinyl butyral with ethanol; and
    poly-vinyl alcohol.

8. The method of claim 1, wherein a size of the ceramic particles ranges from 30 micrometers to 65 micrometers.

9. The method of claim 8, wherein the step of selectively applying the ceramic particles comprises spraying the ceramic particles onto the reduced fiber region.

10. The method of claim 1, wherein the step of masking the non-fiber reduced region comprises one of:

applying a stationary mask over the non-reduced fiber region; and applying a mask attached to an applicator of the ceramic particles.

11. The method of claim 1, wherein the step of densifying the fiber preform comprises one of a chemical vapor infiltration and a chemical vapor deposition process.

12. The method of claim 1, wherein the ceramic particles are formed from a material selected from the group consisting of silicon carbide, silicon nitride, pure silicon, boron carbide, pure carbon, aluminum oxide, hafnia, and combinations thereof.

13. The method of claim 1, wherein the reduced fiber region is a gap defined by a joint between adjacent ones of the plurality of ceramic fiber plies.

14. The method of claim 1, wherein the reduced fiber region is a curved region of the preform wherein one or more plies of the plurality of ceramic fiber plies are bent.

\* \* \* \* \*